United States Patent [19]

Aiello

[11] Patent Number: 4,554,512

[45] Date of Patent: Nov. 19, 1985

[54] SWITCHING AMPLIFIER WITH MOSFET DRIVER CIRCUIT

[75] Inventor: Michael E. Aiello, Monroeville, Pa.

[73] Assignee: Aerotech, Inc., Pittsburgh, Pa.

[21] Appl. No.: 644,775

[22] Filed: Aug. 27, 1984

[51] Int. Cl.[4] .............................................. H03F 3/38
[52] U.S. Cl. ...................................... 330/10; 330/251
[58] Field of Search ............... 330/10, 51, 146, 207 A, 330/251, 277, 300, 311

[56] References Cited

U.S. PATENT DOCUMENTS

| 2,951,212 | 8/1960 | Schmid | 332/9 |
| 3,054,066 | 9/1962 | Crane | 330/251 |
| 3,260,912 | 7/1966 | Gregory | 318/341 |
| 3,294,981 | 12/1966 | Bose | 307/88.5 |
| 3,835,408 | 9/1974 | Shaffer | 330/10 |
| 3,859,604 | 1/1975 | Rankin | 330/10 |
| 3,946,324 | 3/1976 | Smith | 330/10 |
| 4,075,572 | 2/1978 | Cavigelli | 330/10 |

FOREIGN PATENT DOCUMENTS

| 853340 | 11/1960 | United Kingdom | 38/4 |
| 862981 | 3/1961 | United Kingdom | 38/3 |

OTHER PUBLICATIONS

"Switching Inductive Currents with Power Transistors", by Ray A. Colclaser, *Electro Technology*, Oct. 1962, pp. 125–127.

*Primary Examiner*—Eugene R. LaRoche
*Assistant Examiner*—Steven J. Mottola
*Attorney, Agent, or Firm*—Webb, Burden, Robinson & Webb

[57] ABSTRACT

A switching amplifier comprises an input terminal connected to a d.c. power supply and an output terminal connected to a load. At least one power transistor is placed in series with the input and output terminals. A PWM circuit outputs a pulse width modulated signal. An isolating driver circuit between the PWM circuit and the control terminal of the power transistor comprises a low voltage power supply; a transformer having primary and secondary windings; an oscillator for outputting a high frequency signal; means for gating the high frequency signal from the oscillator to the primary winding of the transformer in response to the pulse width modulated signal from the PWM circuit; a MOSFET; means for rectifying the voltage in the secondary winding of the transformer and for applying the rectified voltage to the gate of the MOSFET; and switching means for rapidly discharging the gate of the MOSFET when the high frequency signal is no longer gated to the transformer.

44 Claims, 18 Drawing Figures

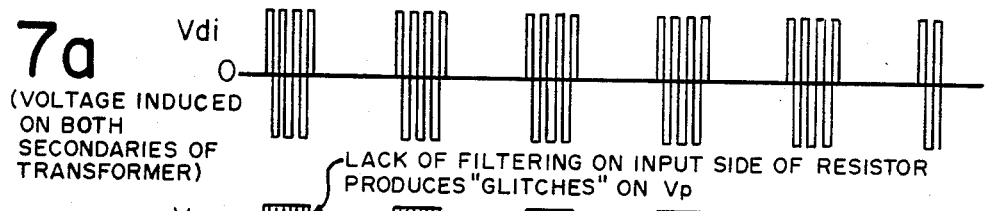
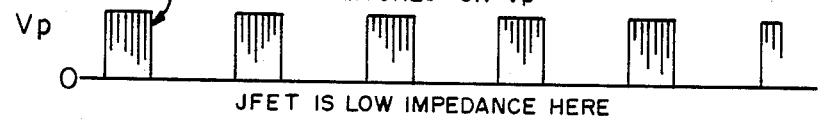
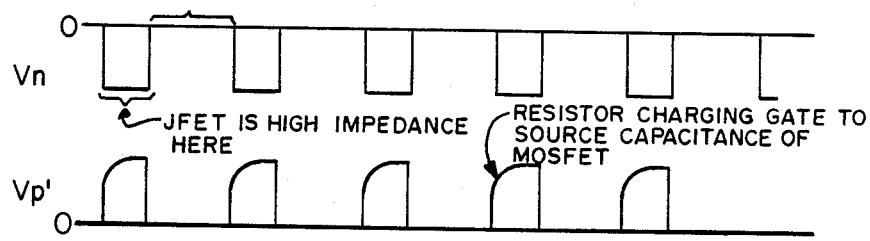

SWITCHING AMPLIFIER WITH MOSFET DRIVER CIRCUIT

BACKGROUND OF THE INVENTION

This invention relates to an improvement in switching amplifiers and particularly to an improvement in the driver circuit for the power transistors thereof.

Typically, switching amplifiers have power (or output) transistors that are controlled fully "on" (saturated) or fully "off" (reverse biased). The power transistors are controlled directly or through driver circuits by a pulse width modulator (PWM) of some suitable variety. The duty cycle of the PWM output pulse chain bears a direct relationship to an analog input (or control) signal. In this way, the average "on" time of the power transistors is directly related to the analog signal input to the PWM.

As is well known in the art, switching amplifiers may have only one power transistor. (See British Pat. No. 862,981 (1961).) They may have two power transistors, for example, back-to-back between power supplies of opposite polarity. (See Crane U.S. Pat. No. 3,054,066, Schmid U.S. Pat. No. 2,951,212 and British Specification No. 853,340 (1960).) They may have four power transistors arranged in a bridge configuration. (See Gregory U.S. Pat. No. 3,260,912 and "Switching Inductive Currents With Power Transistors" by R. Colclaser *Electro-Technology,* October 1962.) This invention pertains to the driver circuit or circuits between the PWM and the power transistor or transistors for any switching amplifier.

As is well understood in the art, switching amplifiers may be self-switching or may be oscillator controlled. Self-switching amplifiers (see Bose U.S. Pat. No. 3,294,981) are typically variable output frequency devices whereas oscillator controlled switching amplifiers are normally fixed frequency output devices. Typically, the frequency is selected in excess of the audible range.

An advantage of this invention is to provide a switching amplifier with high switching rates, say 5 to 30 kilohertz in the case of bipolar output transistors and up to about 100 kilohertz in the case of MOSFET output transistors.

It is another advantage of this invention to provide a switching amplifier characterized by low power consumption due to predominently FET and MOSFET design.

It is a special advantage of this invention to provide a switching amplifier the operation of which is independent of the bus voltage applied to the power transistors and flyback diodes.

It is still another advantage according to this invention to provide a switching amplifier with a high degree of electrical isolation between the PWM control and the final driver circuit.

It is yet another advantage according to this invention to provide a switching amplifier having low cost and low component count.

It is yet another advantage according to this invention to provide a switching amplifier having a driver circuit with a very fast rising and falling drive signal, the rate of the rise of the driver signal being easily adjusted by component selection.

SUMMARY OF THE INVENTION

Briefly according to this invention, there is provided a switching amplifier. The switching amplifier has an input terminal for being connected to a d.c. power supply and an output terminal for being connected to a load. A power transistor is placed in series between the input and output terminals. In the case where the power transistor is a bipolar transistor, the collector-emitter circuit is in series with the input and output terminals. In the case where the power transistor is a MOSFET, the source-drain circuit is placed in series with the input and output terminals.

As used herein, MOSFET refers to a metal oxide semiconductor field effect transistor or any similar semiconductor switch having very high input impedance as compared to bipolar transistors regardless of gate voltage polarity. The power transistor has a control terminal which, in the case of the bipolar transistor, is referred to as the base and in the case of the MOSFET, is referred to as the gate. The switching amplifier includes a pulse width modulation circuit or PWM circuit which outputs a pulse width modulated signal. In a manner well understood in the art, the pulse width modulated signal has a duty cycle which is directly related to an input or control signal applied to the PWM circuit. The elements of the switching amplifier described so far are those known in the prior art.

Switching amplifiers according to this invention further comprise an isolating driver circuit between the PWM circuit and the control terminal of the power transistor. The isolating driver circuit includes a low voltage power supply, say 12 volts with current output in the milliamp range. The isolating driver circuit also includes a transformer having primary and secondary windings. The driver circuit further comprises an oscillator for generating a high frequency signal which frequency is greatly in excess of the switching frequency of the PWM circuit. For example, in the case of bipolar power transistors, the oscillator outputs a frequency in the megahertz range whereas the PWM circuit operates at a frequency between about 5 and 30 kilohertz. In the case of MOSFET power transistors, the frequency of the PWM circuit can be much higher; say up to 100 kilohertz. Preferably, the high frequency oscillator frequency is at least ten times the greatest frequency of the PWM. Means are provided in the isolating driving circuit for gating the high frequency signal from the oscillator to the primary of the transformer in response to the pulse modulated signal from the PWM circuit.

In the case of bipolar power transistors, a MOSFET is arranged in a circuit with the control terminal of the power transistor. No such MOSFET driver is required in the case of MOSFET power transistors. The isolating driving circuit further comprises means for rectifying the voltage in the secondary winding of the transformer and for applying the rectified voltage to the gate of the MOSFET driver (in the case of bipolar power transistors) or to the gate of the MOSFET power transistor in that case. A switching means is provided for rapidly discharging the gate of the MOSFET (which appears in the circuit as a capacitor) when the high frequency signal is no longer gated to the transformer. Preferably, the MOSFET drivers or MOSFET power transistors, as the case may be, are enhancement mode devices. The preferable switching means for rapidly discharging the gate of the MOSFET comprises a JFET. As used herein JFET refers to a junction field effect transistor or any other semiconductor amplifier having high input impedance compared to bipolar transistors at least for one input polarity. The polarity of the rectified secondary winding signal opposite that applied to the MOSFET gate is applied to the gate of the JFET. Hence, the JFET will be non-conducting while the gate of the MOSFET is being charged by the rectified output of the secondary winding. As soon as the rectified output of the secondary winding is discontinued, the JFET becomes conductive discharging the MOSFET gate.

It is preferred according to this invention, that a capacitor and parallel resistor are placed across the gate and one other terminal of the JFET to filter the input to the JFET gate. It is further preferred that a resistor be placed in the charging circuit of the MOSFET gate to slow the charging rate and therefore the turn-on of the MOSFET and in the case of a bipolar power transistor to also slow the turn-on of the bipolar power transistor. Preferably, there is provided a zener diode to protect the gate of the MOSFET from transient voltage conditions.

Preferably, a rectifying means for providing two direct current signals of opposite polarity is implemented with parallel back-to-back diodes. According to a very preferred embodiment of this invention, the rectifying means comprises a centered tapped secondary winding with the center tap comprising the common potential in the MOSFET gate circuit and the rectifying means is a full wave rectifier providing d.c. outputs of opposite polarity.

Preferably, according to this invention, the means for gating the high frequency oscillator signal to the primary comprises a D type flip-flop with the high frequency signal applied to the C input and the PWM signal applied to the R and S inputs. Most preferredly, the primary winding is driven by a transistor bridge comprising two pairs of complementary transistors; one pair being controlled by the Q output of the D type flip-flop and the other pair being controlled by the $\overline{Q}$ output of the flip-flop. In a very preferred embodiment, the high frequency oscillator is disabled when the high frequency signal is not being applied to the primary winding.

In the case of bipolar output transistors and according to a preferred embodiment, a second or additional MOSFET is provided in the base circuit of the bipolar transistor to provide a reverse bias to the base thereof, when the high frequency is not applied to the transformer. The power supply for the reverse bias is an independent power supply capable of providing two volts in the amp output range. The isolating driver circuit is provided with a capacitor on the secondary side of the transformer which is charged during the time the high frequency signal is applied to the transformer. The energy stored on this capacitor is switched to the gate of the additional MOSFET at the time when the high frequency is no longer applied to the transformer. The additional MOSFET thereby connects the base of the power transistor to the reverse bias power supply.

According to a most preferred embodiment according to this invention, there is provided a switching amplifier of the transistor bridge type. In other words, the switching amplifier comprises unidirectional energy source input terminals and load terminals. A transistor bridge connects the source terminals to the load terminals to provide first and second energy paths of opposite direction across the load. The switching means is comprised of at least two distinct pairs of switching transistors for example, bipolar power transistors, which transistors in each pair are controllable simultaneously to be conducting or non-conducting. A PWM circuit provides a pulse width modulated signal at its output. Dead time circuits, one for accepting the PWM output pulse and another for accepting the inverted form of the PWM output pulse, pass pulses of shortened duration (typically by delaying the start of the output pulses). To this point, the description of the switching amplifier of the transistor bridge type is substantially as known in the prior art. The switching amplifier is provided with two isolation transformers, one functionally associated with one pair of switching transistors and the other functionally associated with the other pair of switching elements. A primary side circuit for driving the primaries of both isolation transformers is provided with a high frequency oscillator. Two gate circuits and two switching bridges apply the high frequency oscillator signal to the primary windings of the isolation transformers. The gate circuits apply the high frequency oscillator signal to the respective switching bridges in response to the PWM output pulses delivered by the respective dead time circuits. Secondary side circuits drive the pairs of switching transistors in the transistor bridge through MOSFET drivers. The MOSFET drivers are positioned in the control terminal circuit of the switching transistors. A rectifier rectifies the high frequency voltage signal in the secondary winding and applies the rectified signal to the gate of the MOSFET. A switching device for rapidly discharging the MOSFET when the high frequency signal is no longer gated to the transformer is provided in each secondary side circuit.

THE DRAWINGS

Further features and other objects and advantages of this invention will become clear from the following detailed description made with reference to the drawings in which FIG. 1 is a function level diagram of a switching amplifier according to the one specific embodiment of this invention with an output bridge circuit and a fixed frequency oscillator controlled pulse width modulator;

Figure 2:
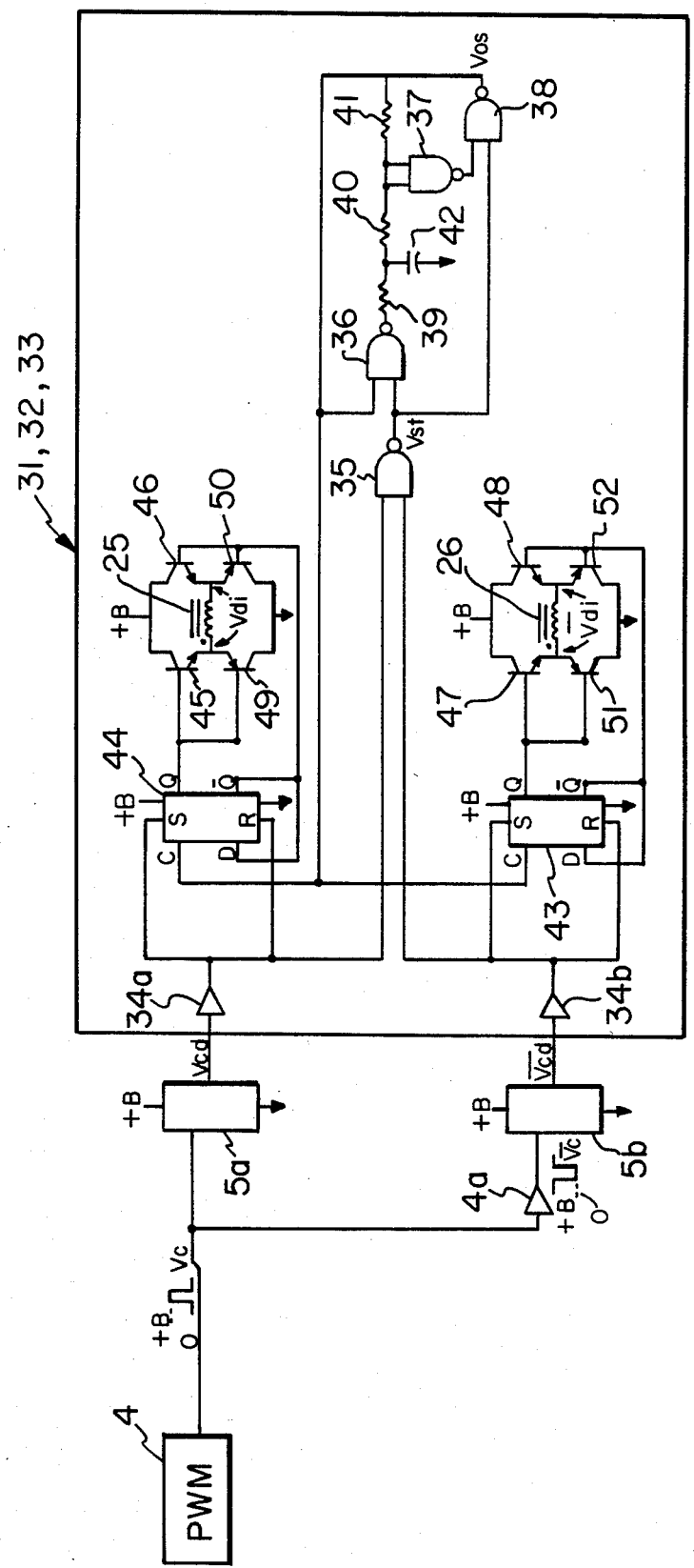
FIG. 2 is a detailed schematic diagram of one portion of the circuit according to FIG. 1.
Figure 3:
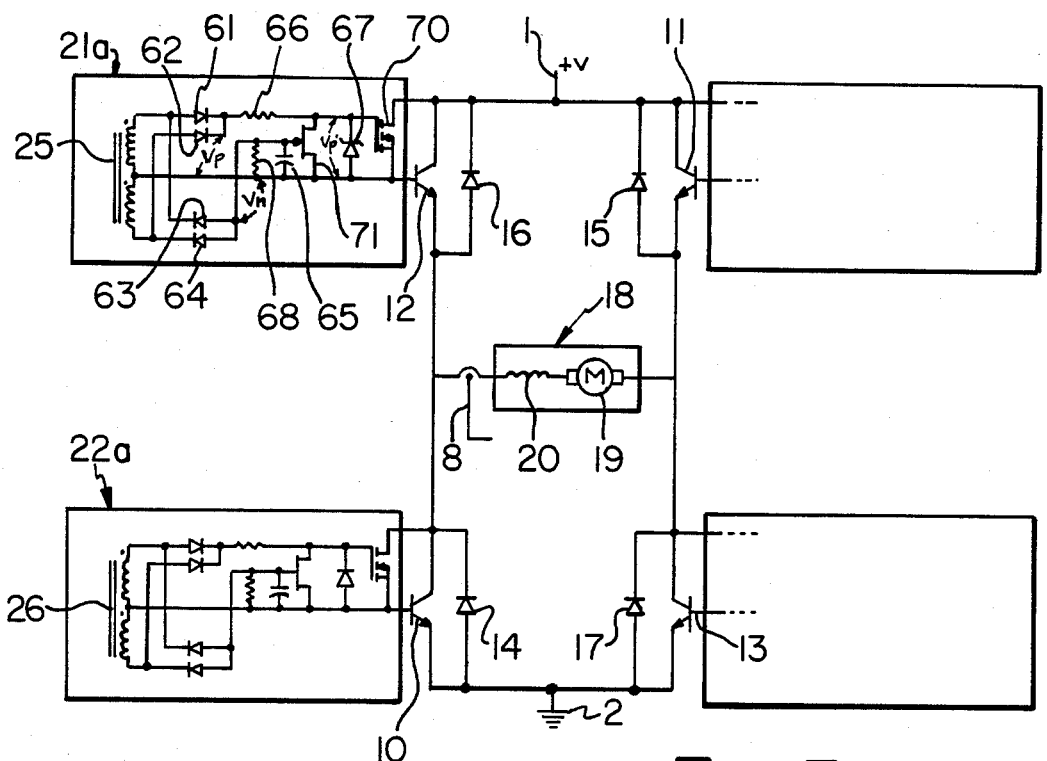
FIG. 3 is a detailed circuit diagram of another portion of the circuit according to FIG. 1.

FIGS. 5a, 5b, 5c, and 5d are pulse waveform diagrams illustrating the operation of the pulse modulation and the dead time circuits;

FIGS. 6a, 6b, 6c, 6d, 6e, and 6f are pulse waveform diagrams illustrating the operation of the circuit shown in FIG. 2; and FIGS. 7a, 7b, 7c, and 7d are pulse waveform diagrams illustrating the operation of the circuit shown in FIG. 3.

DESCRIPTION OF THE PREFERRED EMBODIMENTS

Figure 1:
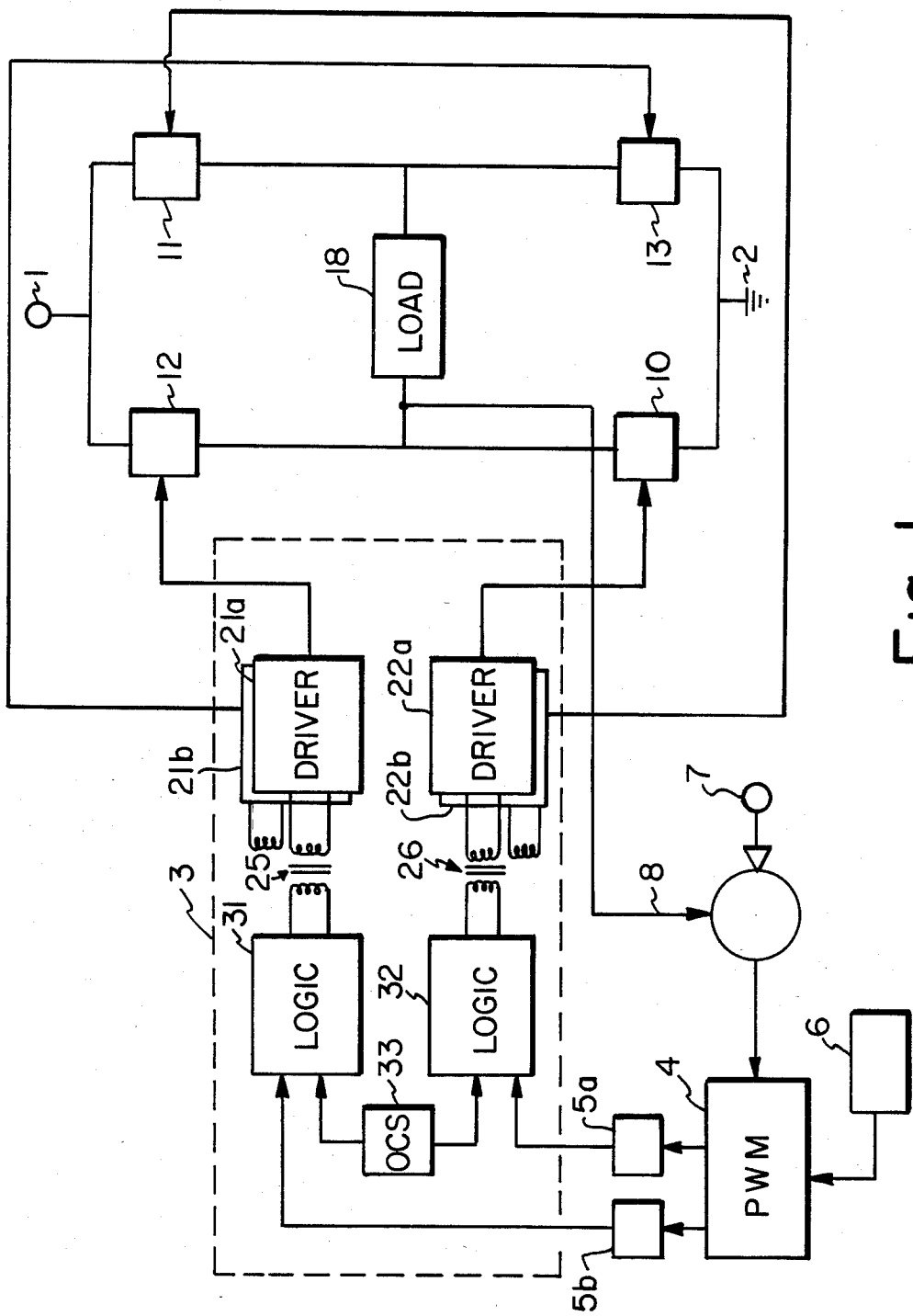

FIG. 1 is a function level diagram of a switching amplifier according to one specific embodiment of this invention with a bridge output circuit and a fixed frequency oscillator pulse width modulator (PWM). The output bridge comprises four control switches 10, 11, 12, and 13 that are controlled in pairs to be conducting or non-conducting to thus pass current from the bus or input power supply terminal 1 through the load 18 to ground 2 through paths of opposite direction. The bridge is driven by isolating driver circuit 3. The isolating driver circuit 3 is controlled by PWM 4 through dead time circuits 5a and 5b. The inputs to the PWM circuit are a fixed frequency signal from oscillator 6 and a current command signal 7 which is summed with a current feedback signal 8. The improvements according to this invention are primarily in the isolating driver circuit 3 which comprises at least two isolating transformers 25 and 26, at least two logic circuits 31 and 32 for gating high frequency signals (say 2 megahertz pulses) to the transformer primaries from a high frequency oscillator 33. The isolating driver circuit also comprises at least two transistor driver circuits 21 and 22. According to this invention, if controls switches 10, 11, 12 and 13 are bipolar transistors, the driver circuits 21a, 21b, 22a, 22b have MOSFET output transistors. As shown on FIG. 1, driver circuits 21a and 21b control switches 12 and 13 and driver circuits 22a and 22b control switches 10 and 11. Each switch is provided with its own driver circuit.

The isolating driver circuit 3 is controlled by the PWM circuit 4 which pulse modulates the output from the oscillator 6 having a frequency between about 5 and 30 kilohertz in response to an analog input signal comprising the summed control signal 7 and the current feedback signal 8. Dead time circuit 5a and 5b modified the PWM outputs prior to application to the isolating driver circuit 3.

While this invention is described with reference to a switching amplifier, which is a fixed frequency oscillator control transistor bridge, it should be understood that the invention has application to all types of switching amplifiers.

Referring now to FIG. 3, the details of the transistor bridge according to FIG. 1 are illustrated. The transistor bridge comprises bipolar power transistors 10, 11, 12, and 13 in this case and of the NPN type. Across each transistor is a flyback diode 14, 15, 16, and 17. The load 18 may comprise a d.c. motor 19 and a choke coil 20. Transistor driver circuits 21a and 21b control power transistor pair 12 and 13 and transistor driver circuits 22a and 22b control power transistor pair 10 and 11.

The transistor driver circuits are synchronously controlled to turn-on either transistor pair 10 and 11 or transistor pair 12 and 13. During shut-down of, say, transistor pair 10 and 11 the flyback diodes 16 and 17 across non-conducting transistors 12 and 13 conduct the current required to discharge the energy stored in the inductance of the motor and/or choke.

The timing of the turn-on and turn-off of transistor pairs is also such as to prevent "switch through", for example, the simultaneous conduction of transistors 11 and 13. The details of the operation of the transistor bridge circuit are well understood. Certain prior art transistor bridge circuits had a flaw in that driver circuit operation was sensitive to the bus voltage. The power supply V+ had to have relatively constant output voltage otherwise bias voltages in the transistor driver circuits became inappropriate and performance declined.

Referring now to FIG. 2, there is shown the PWM circuit 4 as a functional box along with the dead time circuits 5a and 5b as functional boxes and a detail for the logic circuits 31, 32 and oscillator 33.

FIGS. 2 and 3 when combined, disclose a circuit for turning "on" (saturating) bipolar transistors with power MOSFETs. In this circuit, the power transistors are allowed to turn "off" (go into cut-off) at their own speed as soon as the driver MOSFETs are de-energized.

Referring to FIGS. 2 and 3, since the current into the motor load must be bidirectional in order to drive the motor in either rotational direction, both $V_c$ and its inverted signal $\overline{V_c}$ are generated from the output pulses of the PWM. (See FIGS. 5a and 5b) $\overline{V_c}$ is created from $V_c$ by invertor 4a. It should be noted that the PWM circuit, the dead time circuits, and the logic circuits are all supplied by a regulated digital-circuit-power-level power supply; for example, a twelve volt power supply labelled in FIG. 2 as +B. The current output of the +B power supply is in the milliamp range.

Both $V_c$ and $\overline{V_c}$ are processed by the dead time circuits 5a and 5b in order to form control signals $\overline{V_{cd}}$ and $V_{cd}$. (See FIGS. 5c and 5d) More specifically, the input signals to the delay time circuits are "delayed on" thus the pulses output by the dead time circuits are narrower than the input pulses.

It is signals $V_{cd}$ and $\overline{V_{cd}}$ that directly control the logic circuits 31 and 32. The time intervals "td" and "td" shown in FIGS. 5c and 5d (commonly known as the "dead time") are necessary in order to allow one pair of power transistors to be fully turned off before another pair of power transistors are turned on.

The primary function of the logic circuits 31, 32 is to provide a means of transferring the drive control signals $V_{cd}$ and $\overline{V_{cd}}$ to the transistor driver circuits 21 and 22 through a high voltage isolation interface (transformers 25 and 26) without sacrificing speed or noise immunity.

Referring to FIG. 2, the logic circuits comprise transformer drive circuits made up of two D type flip-flops 43 and 44, transistors 45 to 52 and the primary windings of toroidal transformers 25 and 26. The high frequency (for example, 2 megahertz) oscillator comprises NAND gates 35, 36, 37, and 38, resistors 39, 40, and 41, and capacitor 42.

With the signals $V_{cd}$ and $\overline{V_{cd}}$, both in the logic low state (during the dead time intervals "td" and "td"), the set S and reset R inputs of flip-flops 43 and 44 are placed in the logic high state. At this time, the Q and $\overline{Q}$ outputs are both placed in the logic high state. Therefore, the base terminals of all four of the transistors in the transistor bridges driving the primary windings are in the high state. Two parallel transistors in each bridge are therefore non-conducting and no voltage is placed across the primary winding of the transformers.

Also, with signals $V_{cd}$ and $\overline{V_{cd}}$ at logic low, the two high inputs (due to inverters 34a and 34b) applied to NAND gate 35 place its output ($V_{st}$) at logic low thus inhibiting the clock oscillator by holding the output of NAND gate 38 ($V_{os}$) high.

When either $V_{cd}$ or $\overline{V_{cd}}$ goes high (to activate a given transistor driver), $V_{st}$ goes to the high logic state activating the oscillator. (See FIGS. 6a, 6b, and 6c) Signal $V_{os}$ begins clocking at two megahertz. (See FIG. 6d) At the same time, with $V_{cd}$ or $\overline{V_{cd}}$ logic high, the set and reset inputs of one of flip-flops 43 and 44 become logic low allowing the Q and $\overline{Q}$ outputs of that flip-flop to toggle at one megahertz.

Figure 6A:
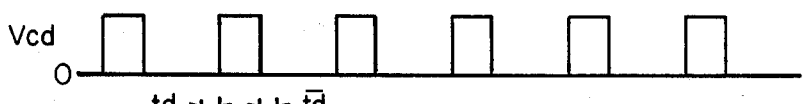
Figure 6B:
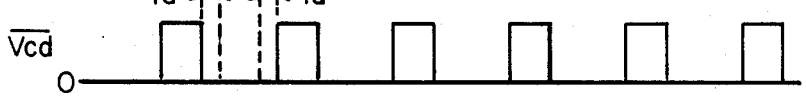
Figure 6C:
Figure 6D:
Figure 6E:
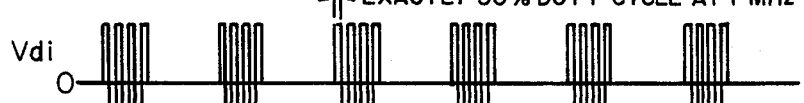
Figure 6F:
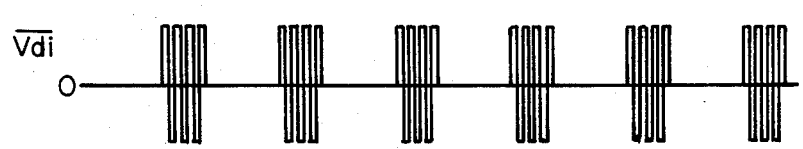

It is this toggling action that of Q and $\overline{Q}$ of the given active flip-flop through the amplifying transistors of the bridge circuits associated therewith that applies a.c. voltages on the primary windings of the transformers 25 (FIG. 6e) and 26 (FIG. 6f). This transfers the signals $V_{cd}$ and $\overline{V_{cd}}$ to the appropriate transistor driver circuit. $V_{di}$ represents the alternating signal across the primary of transformer 25 and $\overline{V_{di}}$ represents the signal across the primary of the transformer 26.

The electrical isolation between the logic circuits 31, 32 and the transistor driver circuits 21, 22 is provided by toroidal transformers 25, 26. Referring back to FIGS. 6e and 6f, note that the voltages $V_{di}$ and $\overline{V_{di}}$ applied on the primaries of transformers 25, 26 appear on both secondary windings of the transformers which are wound 1:1:1. The two secondary windings are joined end-to-end and, in effect, comprise one center tapped winding. Thus with the drive signal $V_{cd}$ set to the logic high state, diodes 61 and 62 in transistor driver 21 rectify the induced transformer voltage $V_{di}$ (see FIG. 7a) to the d.c. value $V_p$. (See FIG. 7b) In turn, diodes 63 and 64 rectify the induced voltage $V_{di}$ to the d.c. value $V_n$. (See FIG. 7c) Note that the voltage $V_{di}$ is essentially a square 1 mkz pulse. However, limitations in transformer slew rate as well as the limited slew rate of the Q and $\overline{Q}$ outputs of the flip-flops tends to slow the leading and trailing edges of voltages $V_{di}$ and $\overline{V_{di}}$. Thus it is necessary to provide the filter capacitor 65 to smooth the voltage $V_n$. Inherently, MOSFET 70 contains its own gate to source capacitance which smooths the voltage $V_p$. (See FIG. 7d)

With induced voltage $V_n$ present, JFET 71 becomes a high impedance, allowing $V_p$ to change to $V_{p'}$ through resistor 66 to energize MOSFET 70. Thus, power transistor 12 (and also power transistor 13) becomes forward biased and saturated (turned on). Zener diode 67 is used to clamp the transient voltages that may be "coupled" to the gate of MOSFET 70 when power transistor 12 is switching on and off. Resistor 66 acts to delay the rising edge of $V_p$ to produce $V_{p'}$. This delay is necessary so that MOSFET 70 does not turn on transistor Q12 too quickly and as a result generate a large voltage spike from the "snapping off" of flyback diode 14. Resistor 68 acts to discharge capacitor 65 when the induced voltage $V_{di}$ is removed from the transformer. JFET 71 acts to discharge the gate to source capacitance of MOSFET 70 (supporting voltage $V_{p'}$), quickly turning off MOSFET 70 when the induced voltage $V_{di}$ is removed from the transformer. Note that it is desirable to quickly turn off MOSFET 70 so as to limit turn off power losses in power transistor 12.

Figure 4:
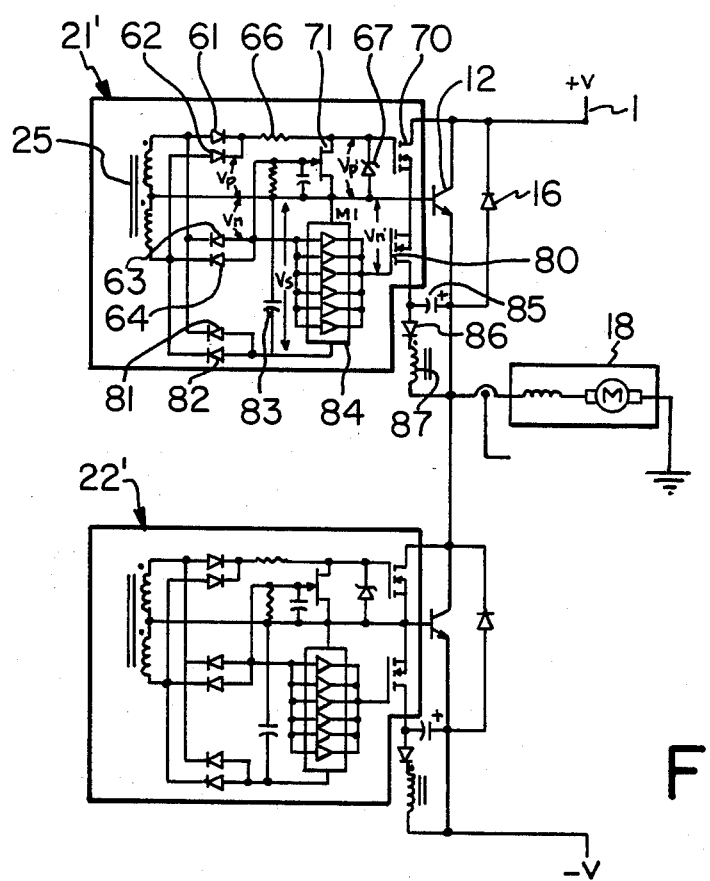
FIG. 4 is a detailed schematic of a portion of an embodiment according to this invention wherein a second power MOSFET is controlled to reverse bias the bipolar transistor.
Figure 5A:
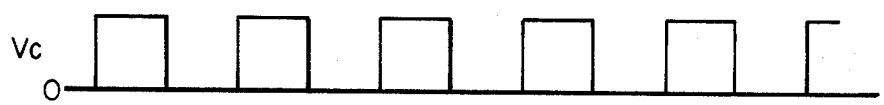
Figure 5B:
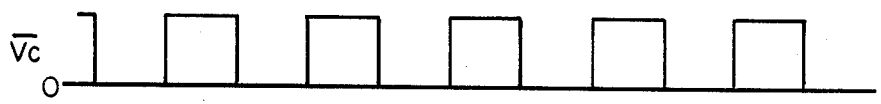
Figure 5C:
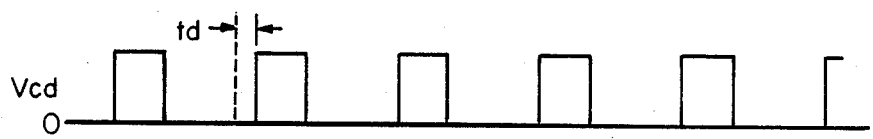
Figure 5D:
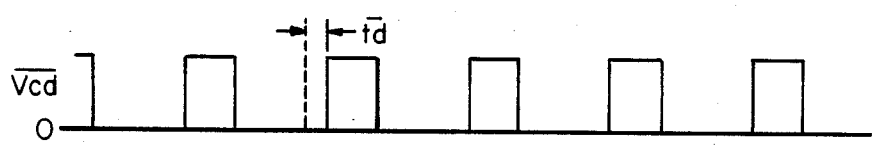

In another embodiment of this invention, which is illustrated by reference to FIGS. 2 and 4, the bipolar transistors are forced to turn off, that is, are "reversed biased" by an additional MOSFET when the first MOSFET is de-energized. Referring to FIG. 4, transistor driver circuits 21' and 22' are shown in detail. The circuit components bearing identical nuemrals to those found in FIG. 3 serve the same functions as already described with reference to FIG. 3. The additional elements or components shown on FIG. 4 relate to the operation of the additional or second MOSFET 80 which is a P channel enhancement mode power MOSFET. Diodes 81 and 82, rectify the voltage pulse on the secondary windings and charge capacitor 83 thus providing positive power supply input to hex inverter buffer 84. Additionally, a small power supply independent of the bus voltage, for example, a small flyback power supply comprised of transformer 87, capacitor 85 and diode 86 provided a reversing biasing voltage to be switched to the base of bipolar transistor 12 by MOSFET 80.

The added feature of reverse bias turn off of the bipolar transistor allows the bases thereof to be negative with respect to their emitters when MOSFET 70 is de-energized and MOSFET 80 is energized. This action facilitates a quicker turn off time of the power transistors and in turn lowers the switching losses. When transformer voltage $V_{di}$ is applied to transformer 25, voltages $V_p$, $V_n$, and $V_{p'}$ are generated energizing MOSFET 70. This saturates (turns on) power transistor 12 in the same manner as was described for the driver circuits shown in FIG. 3. In this circuit, however, an additional voltage $V_s$ is generated charging capacitor 83 and biasing the CMOS inverter/buffer 84. With voltage $V_n$ also present at this time voltage $V_{n'}$ is placed at zero, holding MOSFET 80 in the off state. When the induced voltage $V_{di}$ is removed from the transformer (to turn off power transistor 12) voltage $V_p$, $V_n$, and $V_{p'}$ go to zero turning off MOSFET 70. However, at the same time the generated voltage $V_s$ remains across buffer 84 due to the storage capacitor 83. As $V_n$ goes to zero, $V_{n'}$ is generated, turning on MOSFET 80 and reverse biasing power transistor 12.

The circuit of FIG. 4 differs from the circuit of FIG. 3 in that the latter is an example of a four switch bridge circuit and the former is an example of a two switch circuit having power supplies V+ and V− at potentials above and below a ground potential and one of the output terminals is at ground potential.

In certain switching amplifier applications where low current is permitted but very high frequencies are desired, it is possible to eliminate the bipolar transistors shown in FIG. 3 by placing the MOSFETs 70 in the transistor bridge. Since the current capacity of MOSFETs is limited, the switching element 12 (see FIG. 1) will actually comprise several parallel MOSFETs all controlled by the same gate drive signal.

Two techniques for driving a bipolar power transistor have been disclosed. The first positively controls the power transistors in the forward bias mode only allowing the transistor to turn off by itself (see FIG. 3). The second includes additional circuitry for providing a reverse bias upon the power transistor to increase the turn off speed of the transistor (see FIG. 4).

The components for the specific embodiment disclosed herein with reference to FIGS. 2 and 3 have the types and/or values set forth in the following Table I:

TABLE I

| Component | Type |
|---|---|
| Diodes 61, 62, 63, 64 | IN4148 (small signal diodes) |
| Resistors 66, 68, 39, 40, 41 | ¼ watt |
| Capacitor 65, 42 | Low voltage ceramic |
| JFET 71 | N channel JFET (2N4391) |
| MOSFET 70 | N channel enhancement mode power MOSFET (MTP5N35) |
| Zener diode 67 | 1N4742 |
| Transformers 25, 26 | Toroidal transformer (wound 1:1:1) |
| Power transistors 10, 11, 12, 13 | Bipolar NPN power transistors |
| Diodes 14, 15, 16, 17 | Flyback diodes (high current, fast recovery) |
| Transistors 45–48 | Low voltage/high gain NPN transistors (2N2222) |
| Transistors 49–52 | Low voltage/high gain PNP transistors (2N2907) |
| Flip-flops 43, 44 | CMOS dual flip-flop (MC14013B) |
| NAND gates 35, 36, 37, 38 | CMOS quad/2 input NAND gate (MC14011B) |

The components of the shut off circuit disclosed in the embodiment illustrated in FIG. 4 have the types and values set forth in the following Table II:

TABLE II

| | |
|---|---|
| MOSFET 80 | P channel Power MOSFET (MTP8P10) |
| Capacitor 83 | Low voltage ceramic capacitor |
| Diodes 81, 82 | Small signal diodes (1N4148) |
| Inverter/Buffer 84 | CMOS HEX Inverter buffer (MC14049UB) |

Referring to FIG. 2, it is preferable to restart the oscillator whenever a pulse derived from the PWM circuit gates the oscillator to one of the transistor bridges. This effectively synchronizes the oscillator to the PWM signals everytime $V_{cd}$ and $\overline{V_{cd}}$ go high. This synchronization eliminates possible audible "beat" frequencies between the PWM frequency and the oscillator frequency.

Having thus described the invention in the detail and particularity required by the Patent Laws, what is desired protected by Letters Patent is set forth in the following claims.

I claim:

1. A switching amplifier comprising:
   (a) an input terminal for being connected to a d.c. power supply;
   (b) an output terminal for being connected to a load;
   (c) at least one bipolar power transistor, said transistor having collector, emitter and control terminals, said transistor having its collector-emitter circuit in series with the input and output terminals such that the signal at the control terminal establishes an on or off condition of the bipolar power transistor;
   (d) a PWM circuit outputting a pulse width modulated signal;
   (e) an isolating driver circuit between the PWM circuit and the control terminal of the power transistor comprising:
      (i) a low voltage power supply;
      (ii) a transformer having primary and secondary windings said secondary winding having first and second terminals;
      (iii) an oscillator for outputting a high frequency signal;
      (iv) means for gating the high frequency signal from the oscillator to the primary winding of the transformer in response to the pulse width modulated signal from the PWM circuit;
      (v) a MOSFET having source, drain and gate terminals, said source and drain terminals being arranged in a circuit with the control terminal of the power transistor such that the signal at the gate terminal establishes the on or off condition of the MOSFET;
      (vi) means for rectifying the voltage in the secondary winding of the transformer and for applying the rectified voltage at the first winding terminal to the gate terminal of the MOSFET;
      (vii) switching means for rapidly discharging the gate terminal of the MOSFET when the high frequency signal is no longer gated to the primary winding of the transformer;

whereby the on or off condition of the MOSFET and therefore its ability to control the on or off condition of the bipolar power transistor is substantially entirely independent of the voltage at the input terminal connected to the d.c. power supply.

2. The switching amplifier according to claim 1 wherein the MOSFET is an enhancement mode device with its source-drain circuit connected across the control terminal and collector of the bipolar transistor.

3. The switching amplifier according to claim 2 wherein the switching means comprises a JFET having a gate terminal, the second terminal of the secondary winding being applied to the gate terminal of the JFET.

4. The switching amplifier according to claim 3 wherein a capacitor is placed across the gate terminal and one other terminal of the JFET to filter the gate input.

5. The switching amplifier according to claim 1 wherein rectified output of the secondary winding is applied through a resistor to the gate terminal of the MOSFET to slow the rate at which signal changes take place at the gate terminal of the MOSFET and therefore the rate at which the MOSFET and power transistor enter the on condition.

6. The switching amplifier according to claim 1 wherein a zener diode protects the gate of the MOSFET.

7. The switching amplifier according to claim 1 wherein the rectifying means comprises at least one pair of parallel back-to-back diodes.

8. The switching amplifier according to claim 1 wherein the secondary winding of the transformer having a center tap and the center tap comprises the common potential in the MOSFET gate circuit and the rectifying means is a full wave rectifier.

9. The switching amplifier according to claim 1 wherein the gate means comprises a D type flip-flop having a C (clock) input terminal, R and S input terminals, and $\overline{Q}$ and Q output terminals with a high frequency signal applied to the C (clock) input terminal and the PWM signal coupled to the R and S input terminals.

10. The switching amplifier according to claim 9 wherein the primary winding is driven by a transistor bridge, said bridge having two transistor pairs, one pair being controlled by the Q output terminal of the flip-flop and the other pair being controlled by the $\overline{Q}$ output terminal of the same flip-flop.

11. The switching amplifier according to claim 1 wherein the high frequency oscillator is restarted synchronized to the PWM signal when the PWM signal is active.

12. The switching amplifier according to claim 1 wherein the signal at the amplifier output switches at a rate between about 0 to 30 khz and the oscillator in the isolating driver circuit oscillates at frequencies in excess of about 1 megahertz.

13. A switching amplifier according to claim 1 wherein a circuit comprising a second MOSFET having source, drain and gate terminals, said second MOSFET connected to the control terminal of the power transistor to reverse bias the power transistor when the high frequency signal is not gated to the primary winding of the transformer.

14. A switching amplifier according to claim 13 wherein an independent power supply provides a potential which is applied to the control terminal of the power transistor through the second MOSFET to reverse bias the power transistor.

15. A switching amplifier according to claim 13 wherein a capacitor on the secondary side of the transformer in the isolating driver circuit is charged during the time the high frequency signal is applied to the transformer and the energy stored on the capacitor is switched to the gate terminal of the second MOSFET at the time when the high frequency is no longer applied to the transformer.

16. A switching amplifier according to claim 1, wherein the frequency of the oscillator is at least ten times the greatest frequency of the pulse width modulated signal output by the PWM circuit.

17. A switching amplifier comprising:
(a) an input terminal for being connected to a d.c. power supply;
(b) an output terminal for being connected to a load;
(c) at least one enhancement mode MOSFET transistor, said MOSFET transistor having source, drain and control terminals having its source-drain circuit in series with the input and output terminals such that the signal at the control terminal establishes the on or off condition of the MOSFET transistor;
(d) a PWM circuit outputting a pulse width modulated signal;
(e) an isolating driver circuit between the PWM circuit and the control terminal of the MOSFET comprising:
(i) a low voltage power supply;
(ii) a transformer having primary and secondary windings, said secondary winding having first and second terminals;
(iii) an oscillator for outputting a high frequency signal;
(iv) means for gating the high frequency signal from the oscillator to the primary winding of the transformer in response to the pulse width modulated signal from the PWM circuit;
(v) means for rectifying the voltage in the secondary winding of the transformer and for applying the rectified voltage at the first winding terminal to the control terminal of the MOSFET;
(vi) switching means for rapidly discharging the gate of the MOSFET when the high frequency signal is no longer gated to the transformer;
whereby the on or off condition of the MOSFET is independent of the voltage at the input terminal connected to the d.c. power supply.

18. The switching amplifier according to claim 17 wherein the switching means comprises a JFET, said JFET having a gate terminal, the second terminal of the secondary winding being applied to the gate terminal of the JFET.

19. The switching amplifier according to claim 18 wherein a capacitor is placed across the gate terminal and one other terminal of the JFET to filter the gate input.

20. The switching amplifier according to claim 17 wherein rectified output of the secondary winding is applied through a resistor to the gate terminal of the MOSFET to slow the rate at which the signal changes at the gate terminal of the MOSFET and therefore the rate at which the MOSFET enters the on condition.

21. The switching amplifier according to claim 17 wherein a zener diode protects the gate terminal of the MOSFET.

22. The switching amplifier according to claim 17 wherein the rectifying means comprises at least one pair of parallel back-to-back diodes.

23. The switching amplifier according to claim 17 wherein the secondary winding of the transformer having a center tap and the center tap comprises the common potential in the MOSFET gate circuit and the rectifying means is a full wave rectifier.

24. The switching amplifier according to claim 17 wherein the gate means comprises a D type flip-lfop having a C (clock) input terminal, R and S input terminals, and $\bar{Q}$ and Q output terminals with a high frequency signal applied to the C input terminal and the PWM signal coupled to the R and S input terminals.

25. The switching amplifier according to claim 24 wherein the primary winding is driven by a transistor bridge, said bridge having two transistor pairs being controlled by the Q output terminal of the flip-flop and the other pair being controlled by the $\bar{Q}$ output terminal of the flip-flop.

26. The switching amplifier according to claim 25 wherein the high frequency oscillator is restarted synchronized to the PWM signal when the PWM signal is active.

27. A switching amplifier comprising:
(a) unidirectional energy source input terminals;
(b) load terminals;
(c) a controllable switching means connecting the source terminals to the load terminals to provide first and second energy paths of opposite direction across the load, said switching means comprising at least two switching elements having control terminals, said switching elements being controllable simultaneously to be conducting or non-conducting;
(d) a PWM circuit providing a pulse width modulated signal at its output;
(e) at least two isolation transformers having primary and secondary windings, said secondary windings having first and second terminals;
(f) at least one primary side circuit comprising an oscillator for outputting a high frequency signal, gate circuits and the primary windings of the isolation transformers, said gate circuits gating the high frequency oscillator signal to the primary windings in response to the PWM output pulses;
(g) secondary side circuits for driving said pairs of switching elements in the controllable switching means, said secondary side circuits comprising a MOSFET in the control terminal circuit of the switching elements, said MOSFET having source, drain and control terminals, rectifying means for rectifying the voltage in a second winding of a transformer and for applying rectified voltage at the first winding terminal to the control terminal of the MOSFET, and switching means for rapidly discharging the MOSFET when a high frequency signal is not gated to the transformer.

28. A switching amplifier according to claim 27 wherein the input terminals are of opposite polarity relative to a ground potential and one load terminal is at ground potential.

29. A switching amplifier according to claim 27 wherein the controllable switching means is a bridge circuit.

30. The switching amplifier according to claim 27 wherein the switching elements are bipolar transistors having collector, emitter and control terminals, the MOSFETS are enhancement mode devices with source and drain terminals connected across the control and collector terminals of the bipolar transistors.

31. The switching amplifier according to claim 30 wherein the switching means for discharging the MOSFETs comprise JFETs having control terminals, the second terminals of the secondary windings being applied to the control terminals of the JFETs.

32. The switching amplifier according to claim 31 wherein capacitors and parallel resistors are placed across the gate and one other terminal of the JFETs to filter the gate input.

33. The switching amplifier according to claim 27 wherein rectified outputs of the secondary windings are applied through resistors to the control terminals of the MOSFETs to slow the rate at which the signal changes at the control terminal of the MOSFET and therefore the rate at which MOSFETs and controllable switching elements enter the on condition.

34. The switching amplifier according to claim 27 wherein a zener diode limits the gate voltage of the MOSFETs.

35. The switching amplifier according to claim 27 wherein the rectifying means comprises at least one pair of parallel back-to-back diodes.

36. The switching amplifier according to claim 27 wherein the secondary windings of the transformers have center taps and the center taps comprises the common potential in the MOSFET gate circuits and the rectifying means are full wave rectifers.

37. The switching amplifier according to claim 27 wherein the gate circuits gating the high frequency oscillator signal comprise D type flip-flops having a C (clock) input terminal, R and S input terminals, and $\overline{Q}$ and Q output terminals with the high frequency signal applied to the C input terminals and the PWM signals coupled to the R and S input terminals.

38. The switching amplifier according to claim 27 wherein the primary windings are driven by transistor bridges, said bridges having two transistor pairs, one transistor pair being controlled by the Q output terminal of the flip-flop and the other transistor pair being controlled by the $\overline{Q}$ output terminal of the same flip-flop.

39. The switching amplifier according to claim 27 wherein the signal at the amplifier output switches at a rate between about 0 and 30 khz and the oscillators in the primary side circuits oscillate at frequencies in excess of about 1 megahertz.

40. The switching amplifier according to claim 27 wherein the frequency of the oscillators is at least ten times the greatest frequency of the pulse width modulated signal PWM.

41. A switching amplifier according to claim 27 wherein a circuit comprises additional MOSFETs having source, drain and gate terminals, said MOSFETs connect to control terminals of the switching elements to reverse bias to the switching elements when the high frequency signal is not gated to the primary winding of the transformer.

42. A switching amplifier according to claim 41 wherein an independent power supply provides a reverse bias potential which is applied to the control terminals of the switching elements through the additional MOSFETs.

43. A switching amplifier according to claim 41 wherein capacitors on the secondary side of the transformer in the secondary side circuits are charged during the time the high frequency signal is applied to the primary of the transformers and energy stored on the capacitors is switched to the gate of the additional MOSFET at the time when the high frequency signal is no longer applied to the transformer.

44. A circuit for gating on a MOSFET having a control terminal during a high frequency pulse comprising
(a) an isolation transformer having primary and secondary windings, and high frequency pulse being applied to the primary winding;
(b) means for rectifying a high frequency pulse in the secondary winding during application of the high frequency pulse to the primary and applying it to the control terminal of the MOSFET; and
(c) switching means to discharge the gate of the MOSFET when the alternating voltage in the secondary winding ceases.

* * * * *

UNITED STATES PATENT AND TRADEMARK OFFICE
CERTIFICATE OF CORRECTION

PATENT NO. : 4,554,512

DATED : November 19, 1985

INVENTOR(S) : Michael E. Aiello

It is certified that error appears in the above-identified patent and that said Letters Patent is hereby corrected as shown below:

Claim 27 - Column 12 Line 47 "second" should read —secondary—.

Claim 44 - Column 14 Line 31 "and" should read —said—.

Signed and Sealed this

First Day of April 1986

[SEAL]

Attest:

DONALD J. QUIGG

Attesting Officer

Commissioner of Patents and Trademarks